United States Patent [19]

Ray

[11] 4,092,177
[45] May 30, 1978

[54] THERMOPILE CONSTRUCTION

[76] Inventor: William A. Ray, 4241 Forman Ave., North Hollywood, Calif. 91602

[21] Appl. No.: 715,425

[22] Filed: Aug. 18, 1976

[51] Int. Cl.² ............................................... H01L 35/04
[52] U.S. Cl. .................................... 136/220; 136/208; 136/224
[58] Field of Search ......................... 136/220, 224, 208

[56] References Cited

U.S. PATENT DOCUMENTS

| 2,526,112 | 10/1950 | Biggle | 136/220 |
| 2,987,566 | 6/1961 | Ray | 136/220 X |
| 3,874,935 | 4/1975 | Goslee et al. | 136/224 X |

Primary Examiner—Maynard R. Wilbur
Assistant Examiner—Richard E. Berger
Attorney, Agent, or Firm—Albert M. Herzig; Edward C. Walsh

[57] ABSTRACT

An improved thermopile construction particularly adapted for use as an electric generator for producing a signal in response to heat from a pilot flame. Groups of elongated elements of dissimilar metals are assembled or arrayed in a circle within a metal sleeve to produce a pilot generator. The first group of elements is arrayed against the inside wall of the metal sleeve and the second group of elements is assembled radially inwardly from the first group. Respective ends of the elements of the first group and the second group are joined with the opposite end of the respective end of the element of the second group being joined to the opposite end of the next adjacent element of the first group. Individual elements of each group have a cross-sectional configuration to provide for optimum heat transfer between the sleeve and elements of the first group and to provide for assembly of the elements of the second group in a circle of smaller diameter. The assembly provides for hot thermocouple junctions at one end of the sleeve and cold junctions at the opposite end.

13 Claims, 5 Drawing Figures

THERMOPILE CONSTRUCTION

BACKGROUND OF THE INVENTION

1. Field of the Invention

The field of the invention is primarily that of means for generating electrical current. More particularly, the invention is concerned with a form of thermopile, that is a plurality of series connected thermocouples. Although thermopiles have wide utility, the improved construction of this invention is particularly adapted for use as a generator for generating an electrical signal in response to heat from a pilot flame in gas fired or other installations.

2. Description of the Prior Art

The relevant prior art is found primarily in the field of pilot generators utilized in gas fired heating systems. A form of pilot generator embodying a thermopile has been in use for many years. This particular form consisting of first and second groups of dissimilar metals arrayed in a circle and positioned against the inner side walls of a metal tube or sleeve. In a common form of the device, the elements were in the form of flat metal bands with the hot and cold junctions being provided by way of welds at the ends between the flat end surfaces of the bands, the hot junctions being at one end and the cold junctions at the other. Typical dimensions of this type of construction are, of course, known in the art. In the known commercial constructions typically there have been in some instances 27 thermocouples and in others 30 thermocouples. The prior art constructions described above were subject to some drawbacks. Heat transfer from the outside of the sleeve or jacket to the thermopile elements was less efficient that desired. In one construction, the thermopile elements were arranged in a spiral with part of the elements in the interior of the tube or sleeve resulting in reduced heating efficiency. The response time of the prior art constructions was not as rapid as desired, for example, the time was in the order of 10 to 15 seconds or slower as the time required for the thermopile to produce sufficient power to operate a valve.

Additionally, the prior art constructions were very difficult to fabricate, requiring complicated fabricating machinery, particularly for purposes of making welds between side portions of the ends of adjacent elements.

SUMMARY OF THE INVENTION

In the preferred exemplary form of the invention, it is a thermopile constructed basically as summarized in the abstract. An array of thermopile elements of dissimilar metals is arrayed within a metal sleeve or jacket to which heat from a pilot flame is applied. The thermopile elements are elongated elements, the dissimilar metals preferably being a nickel chrome alloy and nickel copper alloy, the hot junctions being at one end of the tubular array and the cold junctions at the opposite end. In the preferred embodiment there may be 24 junctions. One group of elements of a dissimilar metal is arrayed in a circle and disposed against the inside of the sleeve tube. Elements of the other group are arrayed radially inwardly from the elements of the first group. Preferably the elements of the first group are square in cross section and the elements of the other group are round in cross section, arrayed inwardly of the elements of the first group. The elements of the two groups are joined at the ends providing hot junctions at one end and cold junctions at the other end. The elements are joined by being welded across the ends, each of the inwardly disposed elements being joined at one end to an adjacent outer element with its opposite end being joined to the opposite end of the next adjacent outer element. Insulation is provided in accordance with teachings well-known in the art.

The primary object of the invention is to provide an improved thermopile construction particularly of the type wherein the thermopile elements are arrayed in a circle within a tube or sleeve.

A further object is to provide a construction producing improved thermal contact between thermopile elements and the metal of the sleeve or jacket.

A further object is to provide for long life of the unit by having high temperature thermopile metal elements on the outside, that is radially outward from the other elements.

A further object is to provide an improved space factor, that is to provide a smaller unit that is able to generate increased power.

A further object is to provide a construction wherein one group of elements is disposed radially inwardly from the other with the ends of elements joined by radial instead of circumferential welds.

A further object is to provide an array as set forth in the foregoing wherein the radially outer elements are square in cross section and the inner elements are round in cross section resulting in, among other things, having a better weld between elements.

A further object is to realize a construction wherein all thermocouples are in intimate contact with the outer jacket.

A further object is to realize a unit having substantially fewer thermocouples but yet able to generate increased power.

A further object is to realize faster operation due to improved internal construction and improved intimate outside contact between the outer elements and the jacket.

Further objects and additional advantages of the invention will become apparent from the following detailed description and annexed drawings.

DESCRIPTION OF THE PREFERRED EMBODIMENT

Figure 1:
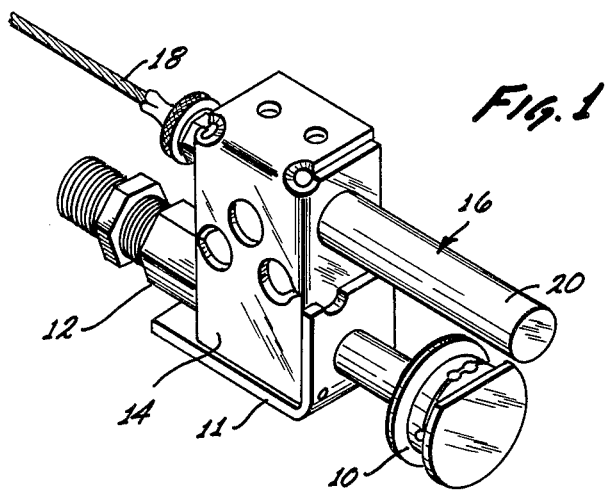
FIG. 1 is an isometric view of a typical pilot burner with associated pilot generator.

FIG. 1 shows a typical exemplary pilot burner 10 carried by a bracket 11. Fittings for connecting the supply tube to the burner are designated at 12. Numeral 14 designates a support member carried by the bracket 11 which carries the pilot generator 16, that is the thermopile assembly. Numeral 18 designates the electrical connections to the pilot generator.

FIGS. 2-5 show in detail the construction of a preferred exemplary form of the pilot generator of the herein invention. The thermopile elements are assembled within the sleeve or jacket 20 made of a metal having good thermal conductivity characteristics. In use the outer end of the jacket is exposed to the pilot flame as may be seen in FIG. 1 so that the hot junctions are at that end with the cold junctions at the opposite end. Heat is conducted along the length of the tube or jacket to the opposite end where the heat is dissipated. The diameter of the jacket tube may be on the order of seven-sixteenths inches.

Figure 5:
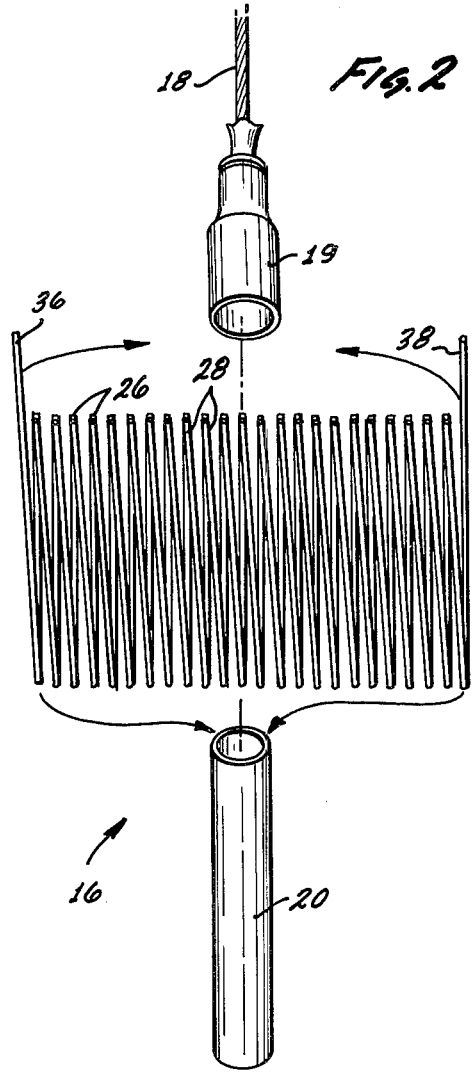
FIG. 5 is a sectional view taken along the line 5—5 of FIG. 4.
Figure 5:
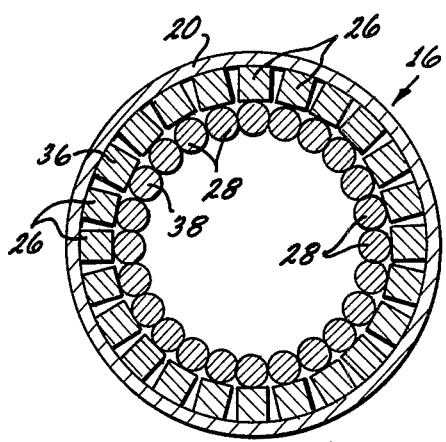

The thermopile elements consist of a first group of elements and a second group, the two groups being of dissimilar materials joined at their ends to provide the hot and cold thermocouple junctions. The two groups of elements are arranged circularly as illustrated in FIG. 5. Numeral 26 designates an individual thermopile element of an outer group arranged in a circle that may be seen in FIG. 5. Numeral 28 designates an individual thermopile element of the second group, also arranged in a circle as shown in FIG. 5. The outer thermopile elements may be elements of nickle chrome alloy and the inner dissimilar elements being nickel copper alloy. A preferred material for the outer array of elements is chrome P special wire. The inner elements positioned radially inwardly from the outer group may be of COPEL or nickel/copper alloy.

FIG. 5 shows the preferred cross sectional shapes of the inner and outer elements, the outer elements being square in cross section and the inner elements being round in cross section, although the invention is not limited to these precise cross-sectional shapes. The square outer elements fit against the inside of the sleeve or jacket 20 as shown for maximum flat surface contact and for the best transfer. The chrome P wire has the capability of being best able to withstand high temperatures. The material of the inner wires if COPEL or nickel/copper alloy is less resistant to temperature. The figures of the drawings show a preferred arrangement wherein there are 24 of the outer elements and 24 of the inner elements providing a similar number of hot and cold junctions.

Figure 2:
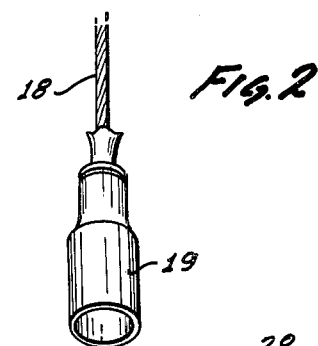
FIG. 2 is an exploded schematic view illustrating the thermopile elements of the herein invention.
Figure 4:
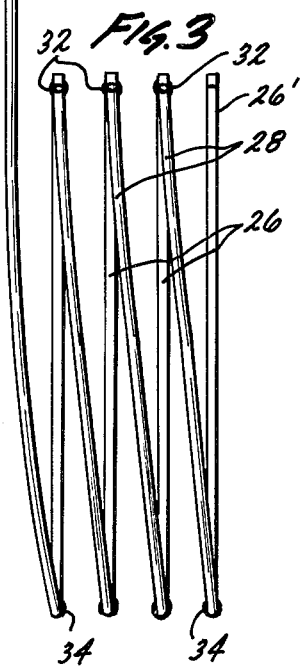
FIG. 4 is an isometric view of a preferred form of the pilot generator.
Figure 3:
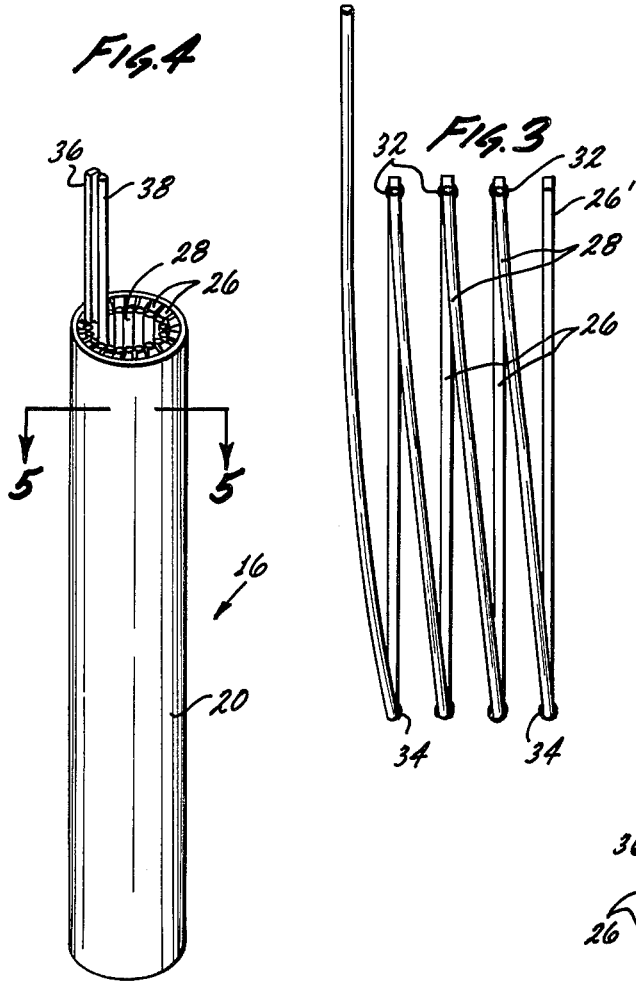
FIG. 3 is an enlarged view of a section of the thermopile elements and the junctions.

FIGS. 2 and 3 show the assemblies of the thermopile elements developed rather than being in the circular configuration. As may be seen in FIG. 3, the element 26 is joined at one end to an element 28 forming a hot junction as designated by the numeral 32. The inner element 28 is joined at its opposite end to the next adjacent outer element 26' forming a junction as designated at 34. The junctions are formed by welding across the outer ends of the elements rather than being between side portions of ends of elements. The hot junctions are formed at one end and the cold junctions are formed at the opposite end. Numerals 36 and 38 designate the electrical terminal connections to the thermopile elements, the junctions, of course, being connected in a series.

The configuration as described and shown is uniquely different from prior art constructions which as previously indicated typically utilize flat wires or bands constituting a radial design with welds between flat surfaces adjacent to ends of the flat wires. With the construction as shown and described, the making of the welds at the ends is greatly facilitated by reason of the fact that welds are across the ends of the elements rather than being between lateral surfaces adjacent to the ends.

FIG. 2 illustrates how the thermopile elements are arrayed into circles as illustrated in FIG. 5 within the sleeve or jacket 20. The electrical connector 18 connects to an end fitting 19 that cooperates with the sleeve or jacket 20.

With respect to dimensions, it can be observed that sleeve or jacket 16, having an exemplary diameter seven-sixteenths inches that other relative dimensions can be observed from the drawings.

With respect to the preferred embodiment as disclosed with 24 couples, it is capable of generating 750 millovolts nominal voltage, and it is capable of responding or reacting sufficiently to activate a valve within 5 seconds.

Those skilled in the art will understand the nature of the invention from the foregoing and the manner in which it achieves and realizes all of the objectives as set forth in the foregoing. As stated, cross-sectional shapes of the elements are exemplary and not limiting. The following criteria are significant. It is of course desired to have good heat transfer between the jacket 20 and the outer ring of the elements. Thus, it is desired that the outer elements have a cross-sectional configuration presenting a side which in the present instance is a flat side to provide good thermal conductivity. Space is, of course, a factor in assembling the elements within a jacket or sleeve of limited diameter. Accordingly, it is desired that the inner ring of elements have a cross-sectional shape allowing the same number of elements to be assembled in a circle of smaller circumference. The diameter of a circular cross section was selected as the preferred dimension for the inner elements, that is the dimension that would permit assembling the same number of elements in a circle of less circumference.

The foregoing disclosure is representative of a preferred embodiment of the invention and is to be interpreted in an illustrative rather than limiting sense, the invention to be accorded the full scope of the claims appended hereto.

What is claimed is:

1. A thermopile having a plurality of elongated dissimilar elements, adjacent dissimilar elements being joined together at opposite ends to provide thermocouple junctions, the said dissimilar elements being arrayed generally in a circle around a central axis, a cylindrical sleeve enclosing the elements, the dissimilar elements including one group arrayed adjacent to the inside surface of the sleeve and a second group having the elements positioned radially inward from the first group, individual elements of the second group being positioned radially inward of adjacent individual elements of the first group.

2. A thermopile as in claim 1, wherein the dissimilar elements are joined together at ends.

3. A thermopile as in claim 1, wherein the first group of elements have a cross-sectional shape providing a surface configurated to provide for good thermal conductivity as between the surface and the inside of the said sleeve.

4. A thermocouple as in claim 3, wherein the elements of the first group have a flat surface positioned substantially contiguous to the inner surface of the sleeve.

5. A thermopile as in claim 4, wherein the elements of the first group are square in cross section.

6. A thermopile as in claim 1, wherein the thermopile is constructed in such a way that heat applied at one end of the sleeve acting on the junctions at that end will cause the thermopile to respond with heat being transferred towards the opposite end of the sleeve and dissipated therefrom whereby to maintain the junctions at the opposite end at a lower temperature.

7. A thermopile having a plurality of elongated dissimilar elements, adjacent dissimilar elements being joined together at opposite ends to provide thermocouple junctions, the said dissimilar elements being arranged generally in a circle around a central axis, the dissimilar elements including a first group arranged in a circle and a second group having the elements arranged in a circle, the elements of the second group being positioned radially with respect to individual elements of the first group, individual elements of the second group being positioned radially inward of adjacent individual elements of the first group.

8. A thermopile as in claim 7 including means holding the elements of the groups in their respective positions.

9. A thermopile as in claim 8 wherein the said last means includes a cylindrical sleeve having the elements of one group arrayed adjacent to a surface of the sleeve.

10. A thermopile as in claim 9 wherein the elements are positioned within the cylindrical sleeve, the elements of one group being arrayed adjacent to the inside surface of the sleeve.

11. A thermopile having a plurality of elongated dissimilar elements, adjacent dissimilar elements being joined together at opposite ends to provide thermocouple junctions, the said dissimilar elements being arrayed generally in a circle around a central axis, a cylindrical sleeve enclosing the elements, the dissimilar elements including one group arrayed adjacent to the inside surface of the sleeve and a second group having the elements positioned radially inward from the first group, the first group of elements having a cross-sectional shape providing a surface configured to provide for good thermal conductivity as between the surface and the inside of the said sleeve, each element of the inner group of elements having a cross-sectional shape to allow an equal number of elements of the second group to be arrayed along a circle of smaller size, inward of the elements of the first group.

12. A thermopile having a plurality of elongated dissimilar elements, adjacent dissimilar elements being joined together at opposite ends to provide thermocouple junctions, the said dissimilar elements being arrayed generally in a circle around a central axis, a cylindrical sleeve enclosing the elements, the dissimilar elements including one group arrayed adjacent to the inside surface of the sleeve and a second group having the elements positioned radially inward from the first group, the first group of elements having a cross-sectional shape providing a surface configured to provide for good thermal conductivity as between the surface and the inside of the said sleeve, the elements of the first group having a flat surface positioned substantially contiguous to the inner surface of the sleeve, the elements of the first group being square in corss-section, and the elements of the second group being round in cross-section.

13. A thermopile having a plurality of elongated dissimilar elements, adjacent dissimilar elements being joined together at opposite ends to provide thermocouple junctions, the said dissimilar elements being arrayed generally in a circle around a central axis, a cylindrical sleeve enclosing the elements, the dissimilar elements including one group arrayed adjacent to the inside surface of the sleeve and a second group having the elements positioned radially inward from the first group, each element of the second group being joined to an end of an element of the first group, the opposite end of the said element of the second group being joined to the opposite end of the next adjacent element of the first group.

* * * * *